(12) United States Patent
Bloks et al.

(10) Patent No.: US 11,774,869 B2
(45) Date of Patent: Oct. 3, 2023

(54) METHOD AND SYSTEM FOR DETERMINING OVERLAY

(71) Applicant: ASML NETHERLANDS B.V., Veldhoven (NL)

(72) Inventors: Ruud Hendrikus Martinus Johannes Bloks, Helmond (NL); Hendrik Cornelis Anton Borger, Eindhoven (NL); Frederik Eduard De Jong, Veldhoven (NL); Johan Gertrudis Cornelis Kunnen, Weert (NL); Siebe Landheer, Eindhoven (NL); Chung-Hsun Li, Eindhoven (NL); Patricius Jacobus Neefs, Raamsdonksveer (NL); Georgios Tsirogiannis, Eindhoven (NL); Si-Han Zeng, Eindhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 72 days.

(21) Appl. No.: 17/599,302

(22) PCT Filed: Jan. 17, 2020

(86) PCT No.: PCT/EP2020/051171
§ 371 (c)(1),
(2) Date: Sep. 28, 2021

(87) PCT Pub. No.: WO2020/207632
PCT Pub. Date: Oct. 15, 2020

(65) Prior Publication Data
US 2022/0171299 A1   Jun. 2, 2022

(30) Foreign Application Priority Data
Apr. 10, 2019   (EP) .................................. 19168502

(51) Int. Cl.
G03F 7/20   (2006.01)
G03F 7/00   (2006.01)

(52) U.S. Cl.
CPC ........ *G03F 7/70875* (2013.01); *G03F 7/7085* (2013.01); *G03F 7/70633* (2013.01)

(58) Field of Classification Search
CPC .. G03F 7/70633; G03F 7/707; G03F 7/70716; G03F 7/7085; G03F 7/70875;
(Continued)

(56) References Cited

U.S. PATENT DOCUMENTS 6,088,080 A   7/2000 Itoh
6,952,253 B2   11/2005 Lof et al.
(Continued)

FOREIGN PATENT DOCUMENTS

WO   2014166704   10/2014
WO   2016012175   1/2016

OTHER PUBLICATIONS

International Search Report and Written Opinion issued in corresponding PCT Patent Application No. PCT/EP2020/051171, dated Jun. 24, 2020.

*Primary Examiner* — Deoram Persaud
(74) *Attorney, Agent, or Firm* — Pillsbury Winthrop Shaw Pittman, LLP

(57) ABSTRACT

A method of determining an overlay value of a substrate, the method including: obtaining temperature data that includes data on measured temperature at one or more positions on a substrate table after a substrate has been loaded onto the substrate table; and determining an overlay value of the substrate in dependence on the obtained temperature data. There is further disclosed a method of determining a performance of a clamping by a substrate table using a determined overlay value.

14 Claims, 8 Drawing Sheets

(58) Field of Classification Search
CPC .......... G03F 7/70508; G03F 7/70525; G03F 7/70616; G05B 19/41875; H01L 22/12; H01L 22/20; Y02P 90/02
See application file for complete search history.

(56) References Cited

U.S. PATENT DOCUMENTS

| | | | |
|---|---|---|---|
| 9,535,335 B2* | 1/2017 | Morimoto | G03F 7/70783 |
| 2002/0183989 A1* | 12/2002 | Chien | H01L 22/20 703/2 |
| 2005/0192699 A1 | 9/2005 | Lin et al. | |
| 2006/0241891 A1 | 10/2006 | Kaushal et al. | |
| 2006/0256305 A1* | 11/2006 | Won | G03B 27/52 355/75 |
| 2007/0052939 A1 | 3/2007 | Ishii et al. | |
| 2008/0204678 A1 | 8/2008 | DiBiase et al. | |
| 2008/0228435 A1* | 9/2008 | Lee | G03F 7/70633 702/150 |
| 2009/0153817 A1 | 6/2009 | Kawakubo | |
| 2010/0014059 A1 | 1/2010 | Van Der Feltz et al. | |
| 2014/0198825 A1 | 7/2014 | Tsai et al. | |
| 2015/0077733 A1 | 3/2015 | Huang et al. | |
| 2017/0109646 A1* | 4/2017 | David | G03F 7/70625 |
| 2020/0356881 A1* | 11/2020 | Bastani | G06N 20/20 |
| 2021/0116818 A1* | 4/2021 | Bastani | G03F 7/70525 |
| 2021/0286270 A1* | 9/2021 | Middlebrooks | G06N 20/00 |

* cited by examiner

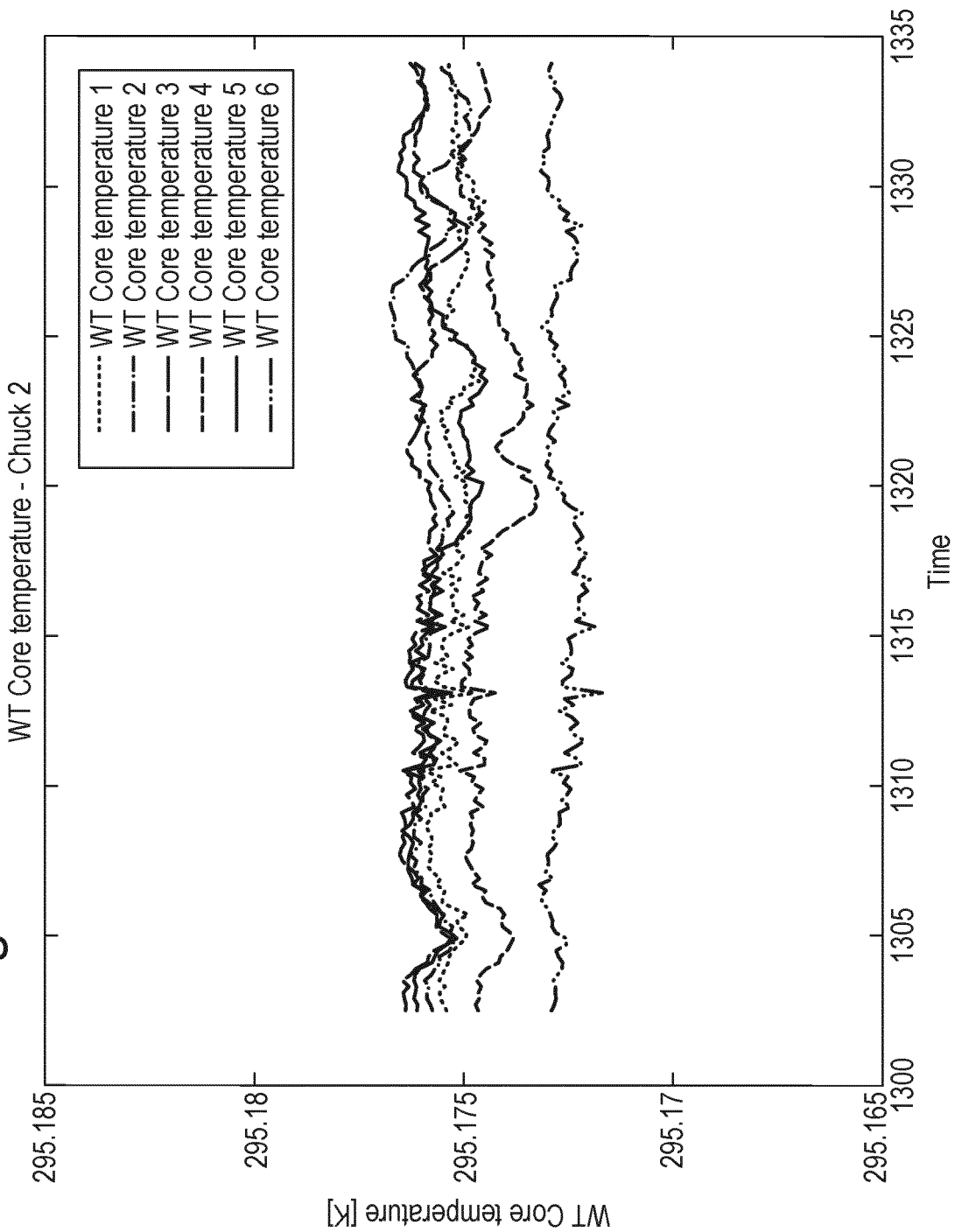

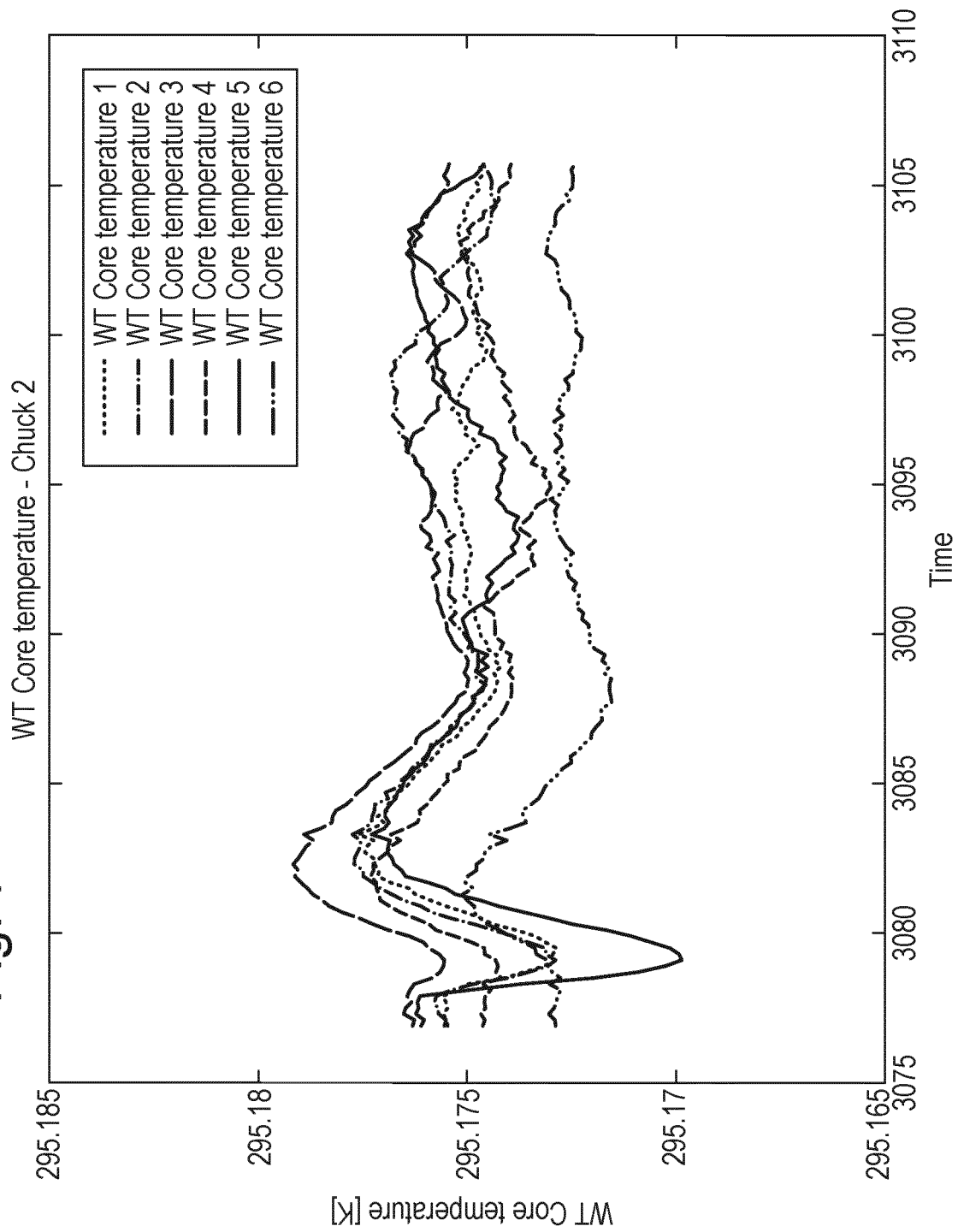

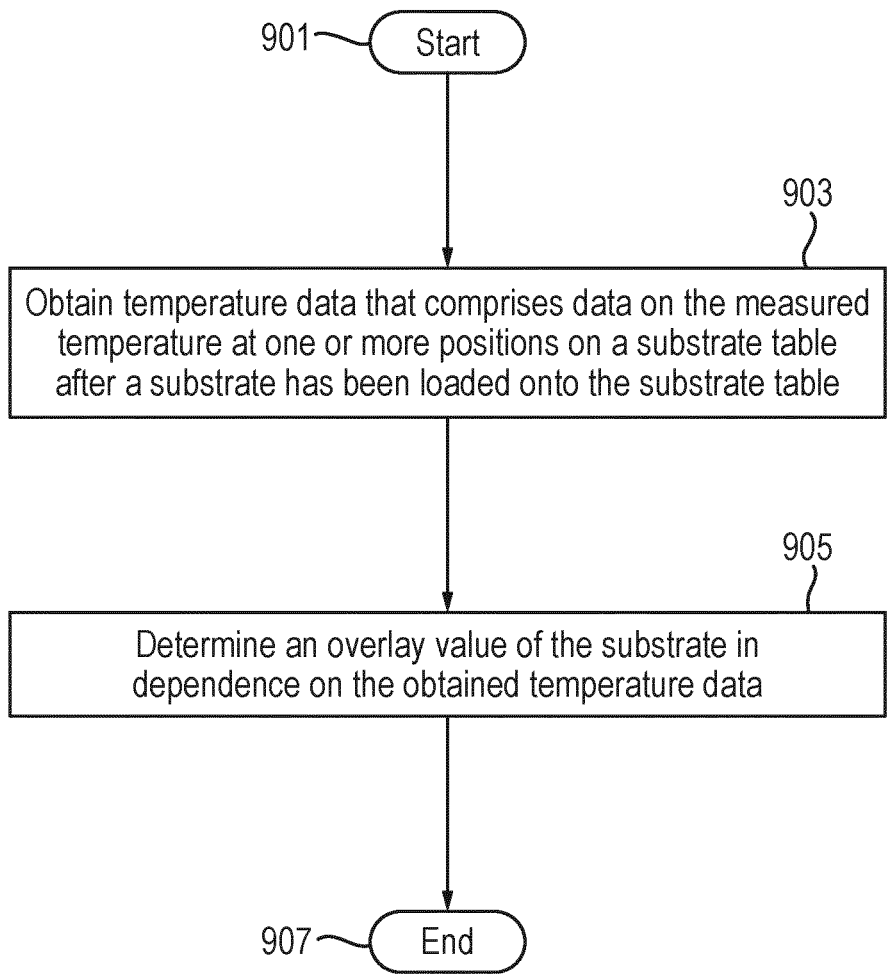

METHOD AND SYSTEM FOR DETERMINING OVERLAY

CROSS-REFERENCE TO RELATED APPLICATIONS

This application is the U.S. national phase entry of PCT Patent Application No. PCT/EP2020/051171, which was filed on Jan. 17, 2020, which claims the benefit of priority of European Patent Application No. 19168502.3, which was filed on Apr. 10, 2019 and which is incorporated herein in its entirety by reference.

FIELD

The present invention relates to the determination of overlay. Embodiments determine a value of overlay of a substrate in dependence on a measured temperature of the substrate table after the substrate has been loaded onto a substrate table.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") of a patterning device (e.g., a mask) onto a layer of radiation-sensitive material (resist) provided on a substrate (e.g., a wafer).

As semiconductor manufacturing processes continue to advance, the dimensions of circuit elements have continually been reduced while the amount of functional elements, such as transistors, per device has been steadily increasing over decades, following a trend commonly referred to as 'Moore's law'. To keep up with Moore's law the semiconductor industry is chasing technologies that enable to create increasingly smaller features. To project a pattern on a substrate a lithographic apparatus may use electromagnetic radiation. The wavelength of this radiation determines the minimum size of features which are patterned on the substrate. Typical wavelengths currently in use are 365 nm (i-line), 248 nm, 193 nm and 13.5 nm. A lithographic apparatus, which uses extreme ultraviolet (EUV) radiation, having a wavelength within a range of 4 nm to 20 nm, for example 6.7 nm or 13.5 nm, may be used to form smaller features on a substrate than a lithographic apparatus which uses, for example, radiation with a wavelength of 193 nm.

An important performance measure of a semiconductor process is overlay. There are many effects that contribute to overlay and these include inaccuracies in the positioning and/or shape of a substrate. Overlay results in an error in the positioning and/or alignment of features in different layers on a substrate.

There is a general need to improve the determination of overlay so that processes can performed in a way that minimises the error caused by overlay.

SUMMARY

According to a first aspect of the invention, there is provided a method of determining an overlay value of a substrate, the method comprising: obtaining temperature data that comprises data on the measured temperature at one or more positions on a substrate table after a substrate has been loaded onto the substrate table; and determining an overlay value of the substrate in dependence on the obtained temperature data.

Preferably, the determined overlay value of the substrate is a residual overlay value.

Preferably, the residual overlay value is an indicator of the overlay error of a layer of the substrate after one or more alignment models have been applied.

Preferably, the method further comprises determining, in dependence on the overlay value, to: scrap the substrate; re-work the substrate; thermally recondition the substrate; select an alignment model for determining a residual overlay value; select an alignment model for evaluating overlay; and/or determine one or more correction values and to perform one or more further processes on the substrate in dependence on the determined one or more correction values.

Preferably, the overlay value is determined for the first production layer of the substrate.

Preferably, the temperature data is obtained from one or more temperature sensors on the substrate table; and the one or more temperature sensors are arranged to measure the temperature of the substrate table.

Preferably, there are a plurality of temperature sensors; and the temperature data comprises data from each of the plurality of temperature sensors.

Preferably, the overlay value is determined in dependence on the obtained temperature data over a measurement time period.

Preferably, the measurement time period starts substantially when the substrate is loaded onto the table; and the measurement time period lasts between 1 μs and 10 s.

Preferably, the overlay value is determined in dependence on the magnitude of the measured temperature by one or more temperature sensors over the measurement time period.

Preferably, the overlay value is determined in dependence on a gradient of the measured temperature by one or more temperature sensors over the measurement time period.

Preferably, the overlay value is determined in dependence on relative values of the measured temperature by different ones of the temperature sensors over the measurement time period.

Preferably, the overlay value is determined in dependence on a comparison of one or more of the values of the measured temperature by one or more of the temperature sensors to one or more reference values.

Preferably, the overlay value is determined in dependence the variance of the temperature data from one or more of the temperature sensors.

Preferably, the overlay value is determined substantially in real-time.

Preferably, the overlay value is a first overlay value and the method further comprises: re-working the substrate; re-loading the substrate onto the substrate table; determining a second overlay value of the substrate, wherein the second overlay value is determined in dependence on obtained temperature data after the substrate has been re-worked and re-loaded onto the substrate table; calculating a re-work difference value of the substrate in dependence on the first overlay value and the second overlay value; and determining the performance of a clamp comprised by the substrate table in dependence on the re-work difference value.

According to a second aspect of the invention, there is provided a substrate support system comprising: a substrate table arranged so that, when in use, a substrate can be loaded onto the substrate table; one or more temperature sensors arranged so that, when in use and after a substrate has been loaded onto the substrate table, the one or more temperature sensors obtain temperature data by measuring the temperature of the substrate table; and a computing system comprising a processor that is configured so that, when in use and a substrate is positioned on the substrate table, the processor determines an overlay value of the substrate in dependence on temperature data obtained by the one or more temperature sensors according to the first aspect of the invention.

According to a third aspect of the invention, there is provided a method of determining the performance of a clamp comprised by a substrate table, the method comprising: determining a first overlay value of a substrate placed on the substrate table; re-working the substrate; re-loading the substrate onto the substrate table; determining a second overlay value of the substrate, wherein the second overlay value is determined after the substrate has been re-worked and re-loaded onto the substrate table; calculating a re-work difference value of the substrate in dependence on the first overlay value and the second overlay value; and determining the performance of the clamp comprised by the substrate table in dependence on the re-work difference value.

Preferably, re-working the substrate is performed in dependence on the first overlay value.

Preferably, the first and second overlay values are residual overlay values.

Preferably, the first and second overlay values are determined according to the first aspect of the invention.

According to a fourth aspect of the invention, there is provided a substrate support system comprising: a substrate table comprising a clamp, the substrate table arranged so that, when in use, a substrate can be loaded onto the substrate table; and a computing system comprising a processor that is configured so that, when in use, the processor determines the substrate clamping performance of the clamp in the substrate table according to the third aspect of the invention.

BRIEF DESCRIPTION OF THE DRAWINGS

Embodiments of the invention will now be described, by way of example only, with reference to the accompanying schematic drawings, in which:

FIG. 6 shows measured temperatures by temperature sensors on the surface of a substrate table;

FIG. 7 shows measured temperatures by temperature sensors on the surface of a substrate table;

FIG. 9 is a flowchart of a process according to an embodiment.

DETAILED DESCRIPTION

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of about 5-100 nm).

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

Figure 1:
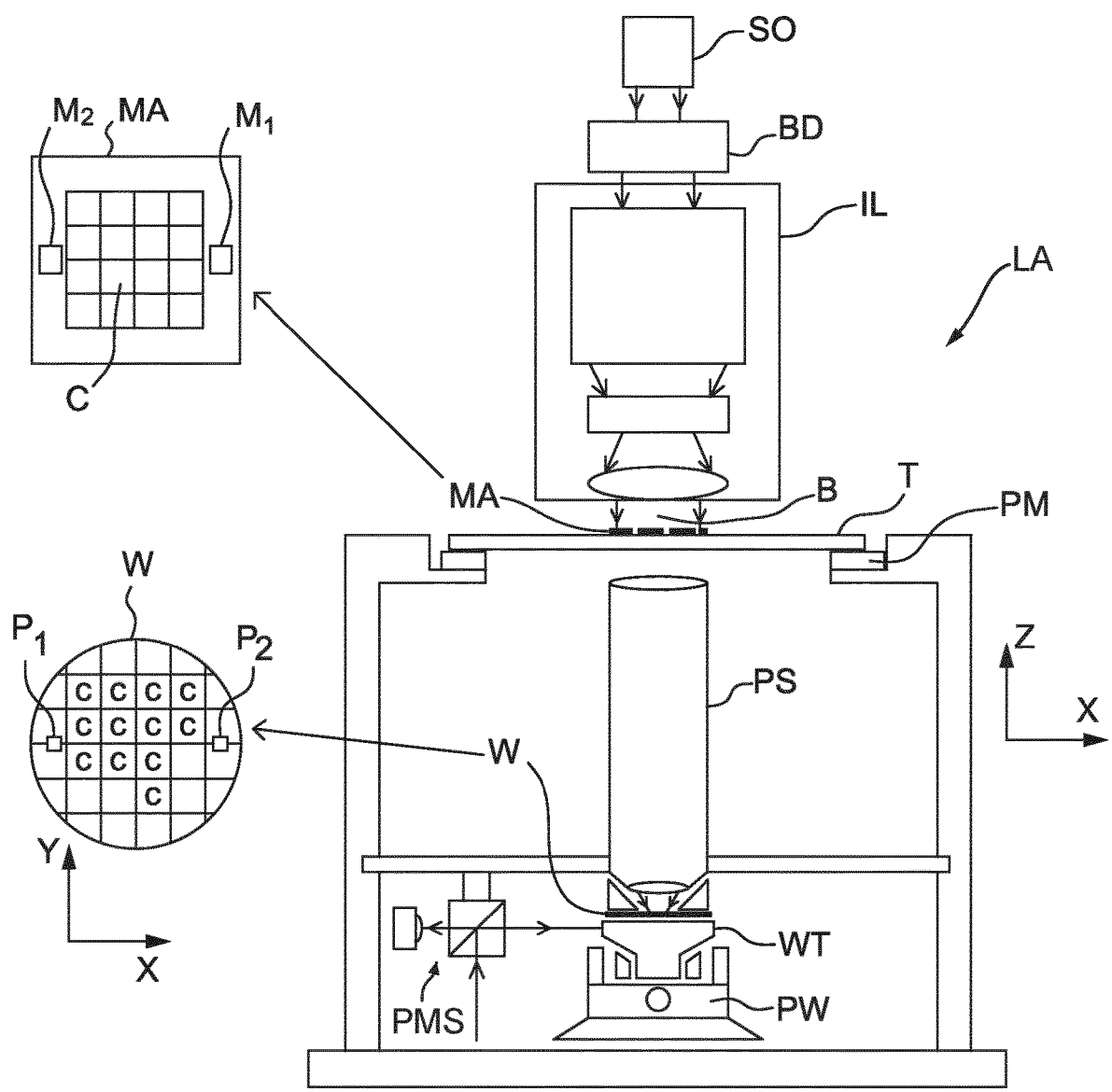
FIG. 1 depicts a schematic overview of a lithographic apparatus.

FIG. 1 schematically depicts a lithographic apparatus LA. The lithographic apparatus LA includes an illumination system (also referred to as illuminator) IL configured to condition a radiation beam B (e.g., UV radiation, DUV radiation or EUV radiation), a mask support (e.g., a mask table) MT constructed to support a patterning device (e.g., a mask) MA and connected to a first positioner PM configured to accurately position the patterning device MA in accordance with certain parameters, a substrate support (e.g., a wafer table) WT constructed to hold a substrate (e.g., a resist coated wafer) W and connected to a second positioner PW configured to accurately position the substrate support in accordance with certain parameters, and a projection system (e.g., a refractive projection lens system) PS configured to project a pattern imparted to the radiation beam B by patterning device MA onto a target portion C (e.g., comprising one or more dies) of the substrate W. The substrate support may be comprised by a substrate support system. The substrate support system may comprise additional components to the substrate support, such as, for example, temperature sensors.

In operation, the illumination system IL receives a radiation beam from a radiation source SO, e.g. via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus LA may be of a type wherein at least a portion of the substrate may be covered by a liquid having a relatively high refractive index, e.g., water, so as to fill a space between the projection system PS and the substrate W—which is also referred to as immersion lithography. More information on immersion techniques is given in U.S. Pat. No. 6,952,253, which is incorporated herein by reference.

The lithographic apparatus LA may also be of a type having two or more substrate supports WT (also named "dual stage"). In such "multiple stage" machine, the substrate supports WT may be used in parallel, and/or steps in preparation of a subsequent exposure of the substrate W may be carried out on the substrate W located on one of the substrate support WT while another substrate W on the other substrate support WT is being used for exposing a pattern on the other substrate W.

In addition to the substrate support WT, the lithographic apparatus LA may comprise a measurement stage. The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is away from the projection system PS.

In operation, the radiation beam B is incident on the patterning device, e.g. mask, MA which is held on the mask support MT, and is patterned by the pattern (design layout) present on patterning device MA. Having traversed the mask MA, the radiation beam B passes through the projection system PS, which focuses the beam onto a target portion C of the substrate W. With the aid of the second positioner PW and a position measurement system IF, the substrate support WT can be moved accurately, e.g., so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions. Substrate alignment marks P1, P2 are known as scribe-lane alignment marks when these are located between the target portions C.

To clarify the invention, a Cartesian coordinate system is used. The Cartesian coordinate system has three axis, i.e., an x-axis, a y-axis and a z-axis. Each of the three axis is orthogonal to the other two axis. A rotation around the x-axis is referred to as an Rx-rotation. A rotation around the y-axis is referred to as an Ry-rotation. A rotation around about the z-axis is referred to as an Rz-rotation. The x-axis and the y-axis define a horizontal plane, whereas the z-axis is in a vertical direction. The Cartesian coordinate system is not limiting the invention and is used for clarification only. Instead, another coordinate system, such as a cylindrical coordinate system, may be used to clarify the invention. The orientation of the Cartesian coordinate system may be different, for example, such that the z-axis has a component along the horizontal plane.

The lithographic apparatus shown in FIG. 1 is typically used for non-immersion DUV applications. Alternative designs of lithographic apparatus are also known. For example, immersion techniques have been introduced into lithographic systems to enable improved resolution of smaller features. In an immersion lithographic apparatus, a liquid layer of immersion liquid having a relatively high refractive index is interposed in a space between a projection system of the apparatus (through which the patterned beam is projected towards the substrate) and the substrate. The immersion liquid covers at least the part of the substrate under a final element of the projection system. Thus, at least the portion of the substrate undergoing exposure is immersed in the immersion liquid. The effect of the immersion liquid is to enable imaging of smaller features since the exposure radiation will have a shorter wavelength in the liquid than gas. (The effect of the immersion liquid may also be regarded as increasing the effective numerical aperture (NA) of the system and also increasing the depth of focus.)

Also known are EUV lithographic apparatus. The design of an EUV lithographic apparatus typically differs from the lithographic apparatus shown in FIG. 1 by the radiation beam being patterned by reflecting off a patterning device instead of being transmitted through the patterning device.

Also known are electron-beam, i.e. e-beam, apparatus that may be used to inspect and/or obtain measurements of substrates.

In all of the above-described UV, DUV, EUV and e-beam apparatuses, as well as other substrate processing apparatuses, a substrate is moved by a substrate handler between substrate tables and one or more processes may be performed on the substrate when the substrate is on a substrate table. When a substrate is on a substrate table, it is necessary for the position and shape of the substrate to be within tolerances.

An important performance measure of a semiconductor process is overlay. There are many effects that contribute to overlay and these include inaccuracies in the positioning and/or shape of a substrate. If overlay becomes too large when a substrate is manufactured, features on different layers of the substrate will not be correctly positioned and/or aligned with each other. The substrate may therefore comprise manufacturing errors.

Overlay may be determined on a plurality of different occasions during the manufacturing process of a substrate. Each overlay determination process may comprise obtaining overlay measurements at a plurality of different positions on the surface of a substrate so that the determined overlay comprises the overlay variation on the surface. The determined overlay may be used for determining corrections that can be applied to alignment models, and other processes, so as to minimise manufacturing errors caused by overlay.

There are a number of different ways of determining overlay and the determination of overlay that is used may be dependent on the most relevant characteristic of overlay for a particular application. A way of determining overlay is with a residual overlay performance indicator, ROPI. ROPI is a determination of the largest overlay occurrence of at least one feature on a substrate. The largest overlay occurrence corresponds to the largest positioning and/or alignment error and therefore the highest risk of manufacturing error. ROPI is therefore an indication of the worst performance.

ROPI may be defined as the remaining overlay after corrections have been applied by an alignment model and/or process.

Figure 2A:
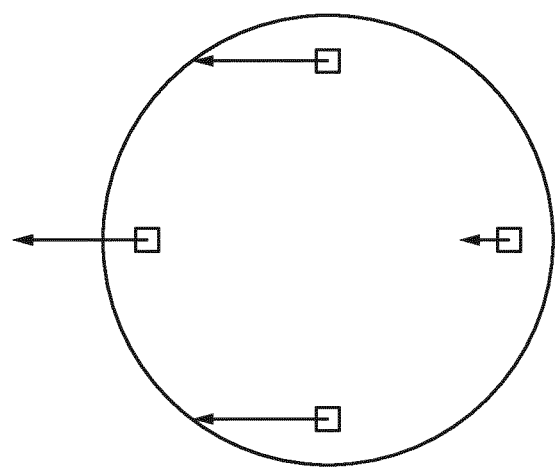
FIGS. 2A and 2B show how a ROPI value may be determined.
Figure 2B:
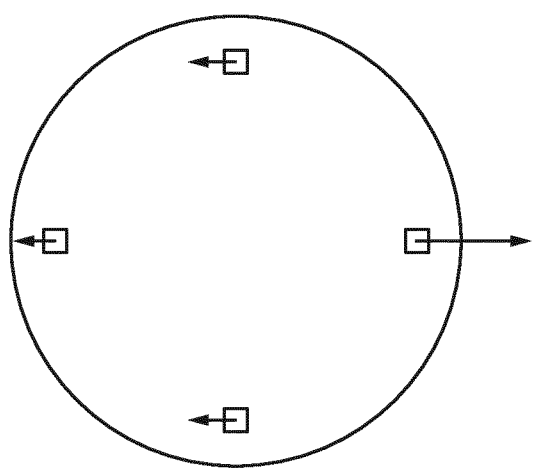

FIG. 2A shows overlay at different positions on the surface of substrate with the length of each of the arrows indicating the magnitude of the overlay in each position. FIG. 2B shows the determined overlay at each of the same positions on the surface of the substrate after a fine wafer alignment, FIWA, model has been applied. The application of the FIWA model has reduced the overlay at most of the positions. ROPI may be determined as the overlay in FIG. 2B, i.e. ROPI is the remaining overlay after the alignment model for reducing the overlay has been applied. ROPI is therefore overlay that cannot be corrected for by the use of a particular alignment model and will be the remaining overlay after the alignment model has been applied.

There are a number of different alignment models that may be used. Different determinations of ROPI may therefore be made by using different alignment models. The specific alignment model that is used to determine ROPI, or otherwise evaluate the determined overlay, may be selected in dependence on the measured overlay.

ROPI is a determination of the largest positioning error of at least one feature on a substrate. The positioning error cannot be corrected after an etch process has been performed. A maximum allowed value of ROPI may be defined in a manufacturing specification. If devices are manufactured on a substrate when the ROPI is above the maximum allowed value, then the positioning error of features of at least some of the devices will cause the devices to fail.

Although the specific value of ROPI is dependent on the selected alignment model used to determine ROPI, all values of ROPI provide a determination of the largest positioning error of at least one feature on a substrate. A determined ROPI value may therefore be used to improve the processes performed on a substrate, no matter how a specific ROPI has been calculated.

Figure 3:
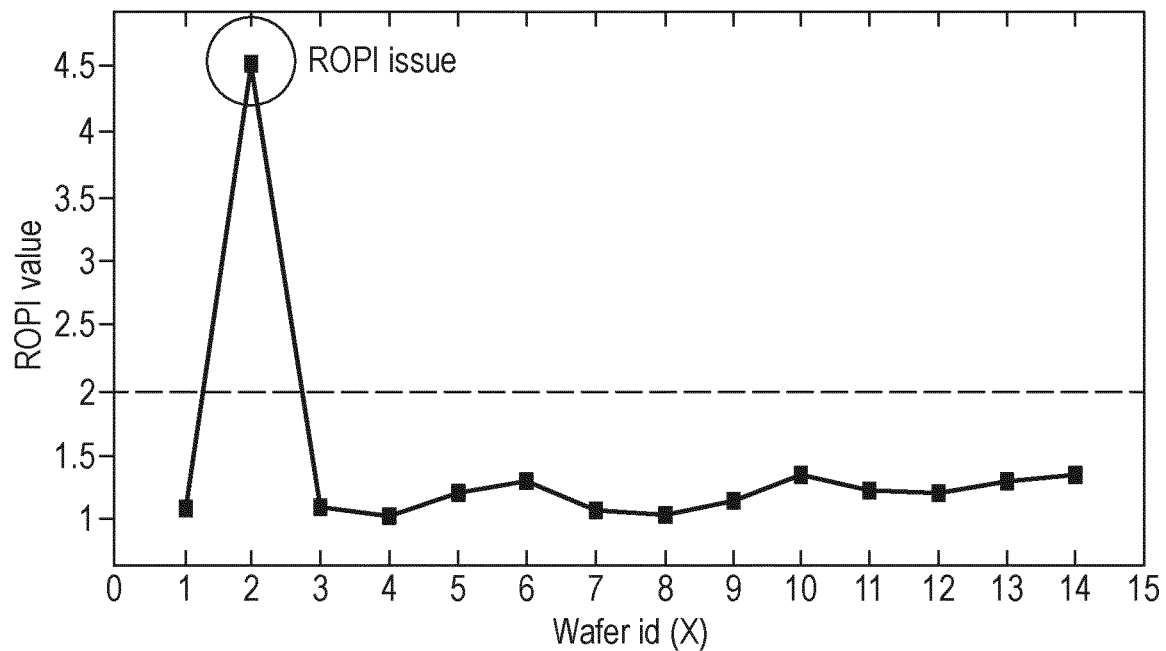
FIG. 3 shows ROPI values for substrates in a production lot.

FIG. 3 shows the ROPI measured for each substrate in a production lot of fourteen substrates. The manufacturing specification for the substrates may be, for example, that the value of ROPI must be below two for each substrate. In the example shown in FIG. 3, all of the substrates in the production lot meet this ROPI requirement except for the second substrate.

In response to the determined ROPI value of the second substrate, it may be determined to scrap this substrate so that the cost of performing further manufacturing processes is not incurred on a substrate with a ROPI value that is too large. Alternatively, in response to the determined ROPI value of the second substrate, the substrate may be re-worked and/or adjustments made to the further processes performed on the substrate.

Figure 4:
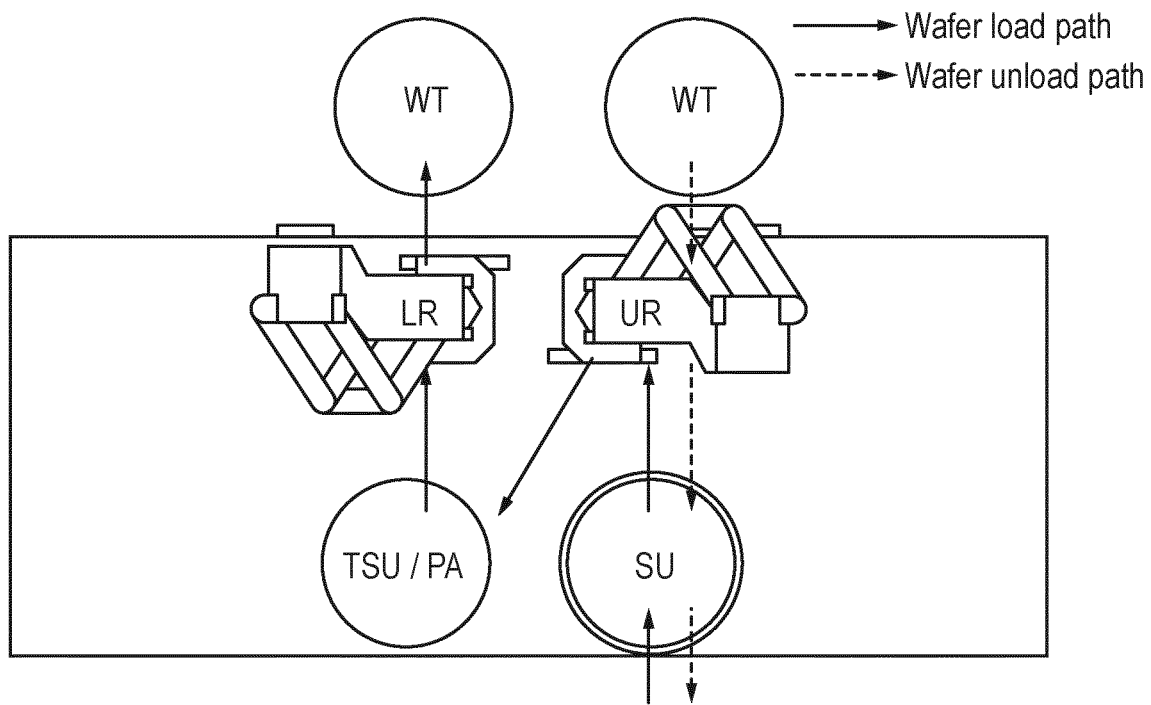
FIG. 4 shows components of a lithography apparatus.

FIG. 4 shows components within a lithographic apparatus. A substrate is moved between different locations by a substrate handler. The overlay of a substrate is dependent on the thermal condition of the substrate. The lithographic apparatus comprises a store unit SU and temperature stabilisation unit TSU for thermally conditioning the substrate. The lithographic apparatus may also comprise air showers for conditioning the air within the lithographic apparatus. Thermally conditioning the substrate reduces its overlay.

A known technique for measuring the overlay of a substrate, that may be used to determine a ROPI value of the substrate, requires determining the location of one or more alignment marks on the substrate. An alignment layer comprising an alignment mark is typically exposed as part of the first production layer with a zero-first combined exposure technique. It is not possible to use an alignment mark to measure overlay, and monitor ROPI performance, for the first production layer.

The earliest occasion that a ROPI value can be determined is therefore with a subsequent production layer to the first production layer. At least the first production layer is already etched before a ROPI value can be determined. When a ROPI value that exceeds an allowed maximum is determined, re-working the substrate will not reduce the ROPI value if the ROPI issue has been caused by the first production layer because an etching process has already been performed that fixes the ROPI value. The substrate will therefore need to be scrapped.

Known techniques include always performing a re-work process if a ROPI value that exceeds an allowed maximum is determined in the second production layer because, with known techniques, it may not be possible to determine if the ROPI issue has been caused by the first or second production layer. If the ROPI issue is caused by the second production layer then re-working the substrate may reduce the ROPI value. However, if the ROPI issue has been caused by the already etched first production layer, the substrate will still need to be scrapped after the re-working process has been performed.

Re-working a substrate may comprise stripping an applied layer on the substrate and re-applying the layer. Instead of, or in addition to, re-working a substrate the substrate may be thermally reconditioned. Each of these processes may reduce the ROPI value of a substrate if the ROPI value has not already been fixed, such as by an etching process.

Although re-working the substrate may reduce a ROPI value to an allowed amount if the ROPI issue has been caused by the second production layer, re-working is still an expensive and time consuming process. When a lithographic apparatus is operated at close to capacity, it may take up to five days for a re-working process to be performed due to the difficulty in scheduling another time for processing the substrate by the lithographic apparatus.

Embodiments provide a new technique for determining the overlay of a substrate. Embodiments also provide a new technique for determining a ROPI value of a substrate.

According to an embodiment, an overlay value is determined in dependence on a measured thermal response of a substrate table after the substrate is loaded onto a substrate table. In an alternative embodiment, a ROPI value is directly determined in dependence on a measured thermal response of a substrate table after the substrate is loaded onto a substrate table. Embodiments also include indirectly determining a ROPI value by calculating a ROPI value in dependence on the determined overlay value. Embodiments therefore provide techniques for determining an overlay value and/or a ROPI value.

Embodiments are described below with reference to the determination of a ROPI value. However, embodiments also include the techniques that are described below also being used to determine only an overlay value.

Embodiments do not require alignment marks to determine a ROPI value. A ROPI value may therefore be determined for a first production layer.

Figure 5:
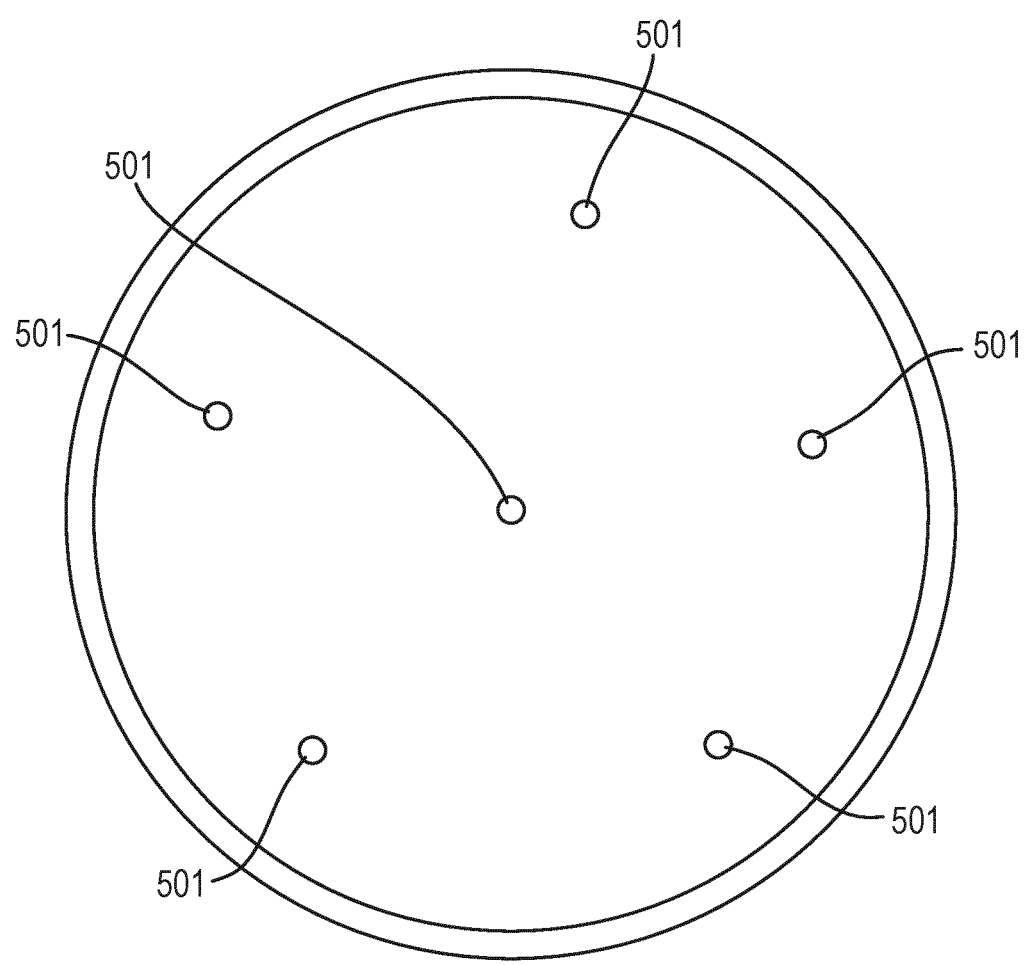
FIG. 5 shows a surface of a substrate table.

FIG. 5 shows six temperature sensors 501 at different locations on a substrate table. Each temperature sensor 501 is arranged to obtain temperature data of the substrate table. The temperature of the substrate table may change in response to a substrate being loaded onto the substrate table and the temperature data obtained by the temperature sensors 501 is therefore a measure of the thermal response of the substrate table to a substrate being loaded on the substrate table. The temperature data may therefore be indicative of the temperature of the core of the substrate.

The measured temperature data from each of the temperature sensors 501 may be provided to a processor that automatically determines a value of a ROPI value for the substrate in dependence on the temperature data.

The processor may determine a measurement time period from which a ROPI value may be determined. The measurement time period may start substantially when the substrate is loaded onto the substrate table and last for between about 1 μs and about 10 seconds. The measurement time period may last for about 5 seconds.

The ROPI value may be determined in dependence on the magnitude of the measured temperature by one or more of the temperature sensors 501 over the measurement time period. For example, a large ROPI value may be determined in dependence on the absolute value of one or more of the measured temperatures and/or the variance of one or more of the measured temperatures.

Alternatively, or additionally, the ROPI value may be determined in dependence on relative values of the measured temperature by different ones of the temperature sensors 501 over the measurement time period.

Alternatively, or additionally, the ROPI value may be determined in dependence on a gradient of the measured temperature by one or more temperature sensors 501 over the measurement time period.

Alternatively, or additionally, the ROPI value may be determined in dependence on a comparison of the measured temperature by one or more temperature sensors 501 over the measurement time period to one or more predetermined reference values.

Filtering and/or averaging operations may be performed on the temperature data from one or more of the temperature sensors 501 during, or prior to, performing any of the processes for determining a ROPI value. For example, the determination of a ROPI value may be made in dependence on a moving average of temperature data from one or more of the temperature sensors 501. The temperature data from more than one of the temperature sensors 501 may be averaged together. For example, the ROPI value may be determined in dependence on a comparison of the temperate data from the single temperature sensor 501 in the centre of the substrate and an average of the temperature data from all of the other temperature sensors 501.

FIGS. 6 and 7 show temperature data from six temperature sensors 501 after a substrate has been loaded onto a substrate table. FIG. 6 shows the temperate data when the ROPI value of a substrate is low and not an issue. FIG. 7 shows the temperate data when the ROPI value of a substrate is large and there is a ROPI issue with the substrate.

When comparing FIGS. 6 and 7, it is clear that when the ROPI value of a substrate is low, the variance of the temperature data from each temperature sensor 501 is relatively low. However, when the ROPI value of a substrate is large and there is a ROPI issue with the substrate, the variance of all of the measured temperatures increases and a substantial gradient change can be detected at the start of the measurement period. The differences in these responses can therefore be used by a processor to automatically determine the ROPI value.

The processor may determine actual ROPI value(s) that are substantially equivalent to what may be determined from alignment marks according to known techniques. Alternatively, the processor may provide one of a predetermined number of outputs. For example, the output determination by the processor may be that there is a ROPI issue with a substrate, there is no ROPI issue with a substrate or that the substrate should be re-worked.

The processor for determining ROPI values may be comprised by a computing system. This may be the same computing system used to make determinations for and/or control the lithographic apparatus, or any other part of the overall system. Alternatively, the processor for determining ROPI values may be comprised by a computing system that is additional to the existing computing systems in known lithographic apparatus.

In the above described embodiment, temperature data is obtained from six different temperature sensors 501. However, embodiments include there being any number of temperature sensors 501. Preferably, the number of temperature sensors 501 is more than two.

The above-described temperature sensors 501 are arranged to measure the temperature of the substrate table. Embodiments include additionally, or alternatively, providing one or more temperature sensors that are arranged to directly measure the temperature of the substrate and not the substrate table. The ROPI value would then be at least in part determined in dependence on the directly measured temperature of the substrate.

Embodiments allow ROPI values to be automatically determined substantially in real-time. In addition, embodiments allow a ROPI value to be determined for the first production layer. This is a substantial advantage over known techniques that can only determine a ROPI value after a subsequent layer to the first production layer has been formed.

As described earlier, the ROPI determination is a determination of the largest positioning error of at least one feature on a substrate. Embodiments provide a new technique for determining ROPI in dependence on a thermal response of a substrate table. The determination according to embodiments is therefore fundamentally different from, for example, the known technique of an accumulated thermal budget determination that does not provide an indication of the largest positioning error of at least one feature on a substrate.

Figure 8A:
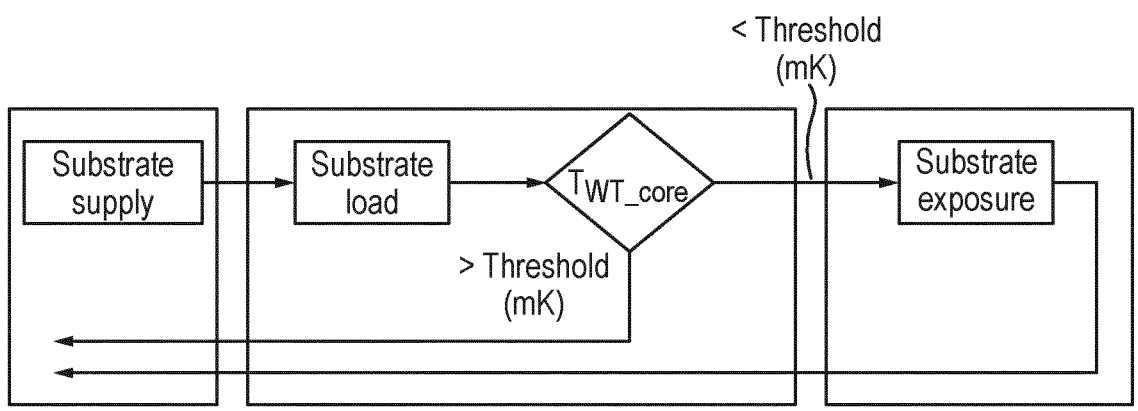
FIG. 8A shows a substrate handling process.
Figure 8B:
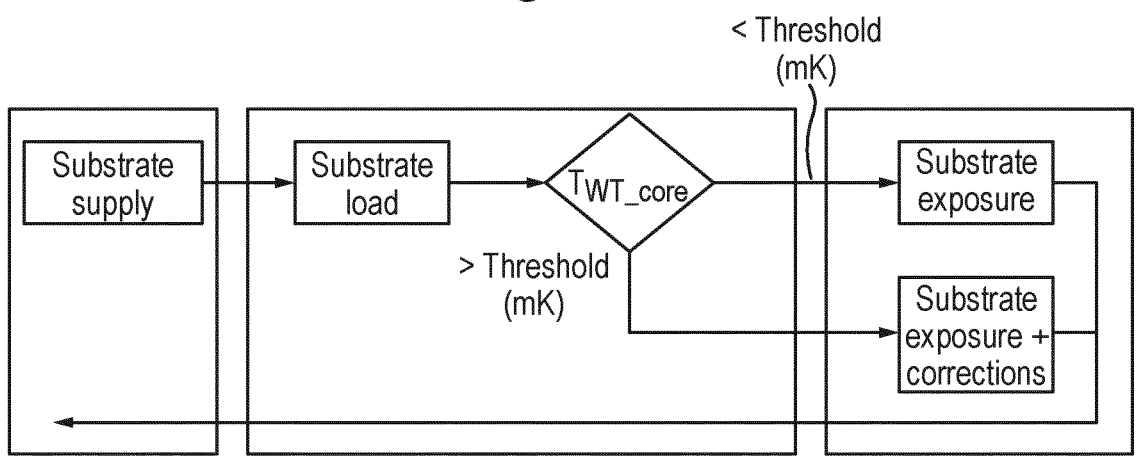
FIG. 8B shows a substrate handling process.

FIGS. 8A and 8B show substrate handling processes according to embodiments.

In FIG. 8A, a substrate is loaded onto a substrate table and a substantially real-time determination is made if the ROPI is an issue according to the above-described techniques according to embodiments. If the ROPI is determined to be consistent with a manufacturing specification, the processing of the substrate proceeds and, for example an exposure process may be performed. Alternatively, if the ROPI is not determined to be consistent with a manufacturing specification, then the substrate is rejected. The rejected substrate may be scrapped, re-worked and/or thermally reconditioned.

FIG. 8B shows an alternative substrate handling process. The substrate handling process comprises an additional determination to that shown in FIG. 8A. In FIG. 8B, a substrate is also loaded onto a substrate table and a substantially real-time determination of a ROPI value is made according to the above-described techniques according to embodiments. A determination is then made of whether one or more subsequent processes, such as an exposure process, should be performed on the substrate with predetermined control parameters, whether one or more subsequent processes, such as an exposure process, should be performed on the substrate with adjusted control parameters or if the substrate should be rejected.

The determination of whether one or more subsequent processes can be performed on the substrate with predetermined control parameters or if the substrate should be rejected correspond to the substrate handling actions described with reference to FIG. 8A.

If a determination is made to perform one or more subsequent processes on the substrate with adjusted control parameters, then embodiments include determining adjustment values of the control parameters in dependence on the determined ROPI value. The one or more further processes may then be performed with the adjusted control parameters. The use of adjusted control parameters may reduce the ROPI of the substrate.

Embodiments also include the above-described techniques being used to determine an overlay value that is not a ROPI value.

FIG. 9 shows a flowchart of a method of determining an overlay value of a substrate according to an embodiment.

In step 901, the method begins.

In step 903, temperature data is obtained that comprises data on the measured temperature at one or more positions on a substrate table after a substrate has been loaded onto the substrate table.

In step 905, an overlay value of the substrate is determined in dependence on the obtained temperature data.

In step 907, the method ends.

The method may further comprise determining, in dependence on the overlay value, to: scrap the substrate; re-work the substrate; thermally recondition the substrate; select an alignment model for determining a residual overlay value; select an alignment model for evaluating overlay; and/or determine one or more correction values and to perform one or more further processes on the substrate in dependence on the determined one or more correction values. The overlay value may be a ROPI value.

Embodiments additionally include the use of ROPI values for monitoring substrate clamping degradation of the substrate table. The substrate table comprises a clamp for holding the substrate to the substrate table. The performance of the clamp may degrade over time. The performance of the clamp should therefore be monitored so that it is known when it is necessary for the clamp to be replaced. Replacing the clamp may comprise replacing the entire substrate table, the clamp being included within the substrate table.

A known technique for determining the substrate clamp performance is to perform a wafer load grid (WLG) test. However, the result of a WLG test does not correlate well to the actual performance of the clamp in a substrate table. This may cause the clamp to be replaced too early, with leads to productivity loss and increases costs, or too late, which leads to a yield loss. In addition, monitoring the substrate clamp degradation by performing WLG tests takes time and thereby causes productivity losses.

Embodiments provide a new technique for determining the substrate clamp performance and thereby monitoring the substrate clamp degradation. According to embodiments, the performance of a substrate clamp is determined in dependence on the difference in measured ROPI values of a substrate. A first ROPI value is determined when a substrate is loaded onto a substrate table according to the techniques in the above-described embodiments. As described above, a determination may be made to re-work the substrate in dependence on the determined first ROPI value. After the substrate has been re-worked, the same substrate may be re-loaded onto the same substrate table and a second ROPI value determined for the substrate. A re-work difference value can then be determined that is dependent on the difference between the second ROPI value (after the re-work) and the first ROPI value (before the re-work).

The inventors have realised that the re-work difference value correlates well to the performance of the clamp of the substrate table. Determinations of re-work difference values can therefore be used to monitor the substrate clamping performance and to determine if the performance of the substrate clamp has degraded to the extent that the clamp, or the substrate table and clamp, should be replaced. For example, when the re-work difference value is above a certain threshold value, a determination may be made to change the clamp, or substrate table and clamp.

The proportion of substrates that are determined to require re-working may be between 3-10%, and a re-work difference value may be determined for each of the re-worked substrates. A sufficient number of re-worked difference values may therefore be determined for appropriate monitoring of the clamping performance from the existing re-work rate requirement. Additional measurements and/or tests may therefore not be required to determine and monitor the performance of the clamp.

Although the above technique of determining the performance of a substrate clamp is described with reference to ROPI values, embodiments more generally include determining the performance of a substrate clamp in dependence on overlay values.

Although the above technique of determining the performance of a substrate clamp is described with reference to the same substrate being re-loaded onto a substrate table after the substrate has been re-worked, embodiments more generally include a re-work difference value being determined in dependence on ROPI values determined for two identical substrates that are loaded onto a substrate table. The two identical substrates may be identical in that they have the same size, shape and form.

The techniques according to embodiments may be applied in all apparatuses in which a substrate is loaded onto a substrate table. In particular, embodiments may be performed in any of UV, DUV, EUV and e-beam apparatuses, as well as other substrate processing apparatuses.

Embodiments are provided according to the following clauses:

1. A method of determining an overlay value of a substrate, the method comprising:
    obtaining temperature data that comprises data on the measured temperature at one or more positions on a substrate table after a substrate has been loaded onto the substrate table; and
    determining an overlay value of the substrate in dependence on the obtained temperature data.
2. The method according to clause 1, wherein the determined overlay value of the substrate is a residual overlay value.
3. The method according to clause 2, wherein the residual overlay value is an indicator of the overlay error of a layer of the substrate after one or more alignment models have been applied.
4. The method according to any preceding clause, the method further comprising determining, in dependence on the overlay value, to:
    scrap the substrate;
    re-work the substrate;
    thermally recondition the substrate;
    select an alignment model for determining a residual overlay value;
    select an alignment model for evaluating overlay; and/or
    determine one or more correction values and to perform one or more further processes on the substrate in dependence on the determined one or more correction values.
5. The method according to any preceding clause, wherein the overlay value is determined for the first production layer of the substrate.
6. The method according to any preceding clause, wherein the temperature data is obtained from one or more temperature sensors on the substrate table; and the one or more temperature sensors are arranged to measure the temperature of the substrate table.
7. The method according to clause 6, wherein there are a plurality of temperature sensors; and the temperature data comprises data from each of the plurality of temperature sensors.

8. The method according to any preceding clause, wherein the overlay value is determined in dependence on the obtained temperature data over a measurement time period.

9. The method according to clause 8, wherein the measurement time period starts substantially when the substrate is loaded onto the table; and the measurement time period lasts between 1 µs and 10 s.

10. The method according to clause 8 or 9, wherein the overlay value is determined in dependence on the magnitude of the measured temperature by one or more temperature sensors over the measurement time period.

11. The method according to any of clauses 8 to 10, wherein the overlay value is determined in dependence on a gradient of the measured temperature by one or more temperature sensors over the measurement time period.

12. The method according to any of clauses 8 to 11, wherein the overlay value is determined in dependence on relative values of the measured temperature by different ones of the temperature sensors over the measurement time period.

13. The method according to any of clauses 8 to 12, wherein the overlay value is determined in dependence on a comparison of one or more of the values of the measured temperature by one or more of the temperature sensors to one or more reference values.

14. The method according to any of clauses 8 to 13, wherein the overlay value is determined in dependence the variance of the temperature data from one or more of the temperature sensors.

15. The method according to any preceding clause, wherein the overlay value is determined substantially in real-time.

16. The method according to any preceding clause, wherein the overlay value is a first overlay value and the method further comprises:
re-working the substrate;
re-loading the substrate onto the substrate table;
determining a second overlay value of the substrate, wherein the second overlay value is determined in dependence on obtained temperature data after the substrate has been re-worked and re-loaded onto the substrate table;
calculating a re-work difference value of the substrate in dependence on the first overlay value and the second overlay value; and
determining the performance of a clamp comprised by the substrate table in dependence on the re-work difference value.

17. A substrate support system comprising:
a substrate table arranged so that, when in use, a substrate can be loaded onto the substrate table;
one or more temperature sensors arranged so that, when in use and after a substrate has been loaded onto the substrate table, the one or more temperature sensors obtain temperature data by measuring the temperature of the substrate table; and
a computing system comprising a processor that is configured so that, when in use and a substrate is positioned on the substrate table, the processor determines an overlay value of the substrate in dependence on temperature data obtained by the one or more temperature sensors according to the method of any preceding clause.

18. A method of determining the performance of a clamp comprised by a substrate table, the method comprising:
determining a first overlay value of a substrate placed on the substrate table;
re-working the substrate;
re-loading the substrate onto the substrate table;
determining a second overlay value of the substrate, wherein the second overlay value is determined after the substrate has been re-worked and re-loaded onto the substrate table;
calculating a re-work difference value of the substrate in dependence on the first overlay value and the second overlay value; and
determining the performance of the clamp comprised by the substrate table in dependence on the re-work difference value.

19. The method according to clause 18, wherein re-working the substrate is performed in dependence on the first overlay value.

20. The method according to clause 18 or 19, wherein the first and second overlay values are residual overlay values.

21. The method according to any of clauses 18 to 20, wherein the first and second overlay values are determined according to the method of any of clauses 1 to 16.

22. A substrate support system comprising:
a substrate table comprising a clamp, the substrate table arranged so that, when in use, a substrate can be loaded onto the substrate table; and
a computing system comprising a processor that is configured so that, when in use, the processor determines the substrate clamping performance of the clamp in the substrate table according to the method of any of clauses 18 to 21.

Although specific reference may be made in this text to the use of a lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

Although specific reference may have been made above to the use of embodiments of the invention in the context of optical lithography, it will be appreciated that the invention, where the context allows, is not limited to optical lithography and may be used in other applications, for example imprint lithography.

Where the context allows, embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device/system). For example, a machine-readable medium may include read only memory (ROM); random access memory (RAM); magnetic storage media; optical storage media; flash memory devices; electrical, optical, acoustical or other forms of propagated signals (e.g. carrier waves, infrared signals, digital signals, etc.), and others. Further, firmware, software, routines, instructions may be described herein as performing certain actions. However, it should be appreciated that such descriptions are merely for convenience and that such actions in fact result from computing devices/systems, processors, controllers, or other devices executing the firmware, software, routines, instructions, etc. and in doing that may cause actuators or other devices to interact with the physical world.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. A method of determining an overlay value of a substrate, the method comprising:
   obtaining temperature data that comprises data on the measured temperature at one or more positions on a substrate table after a substrate has been loaded onto the substrate table; and
   determining, by a hardware computer, an overlay value of the substrate in dependence on the obtained temperature data over a measurement time period and in dependence on a variance of the obtained temperature data at the one or more positions.

2. The method according to claim 1, wherein the determined overlay value of the substrate is a residual overlay value.

3. The method according to claim 2, wherein the residual overlay value is an indicator of the overlay error of a layer of the substrate after one or more alignment models have been applied.

4. The method according to claim 1, further comprising determining, in dependence on the overlay value, to:
   scrap the substrate;
   re-work the substrate;
   thermally recondition the substrate;
   select an alignment model for determining a residual overlay value;
   select an alignment model for evaluating overlay; and/or
   determine one or more correction values and to perform one or more further processes on the substrate in dependence on the determined one or more correction values.

5. The method according to claim 1, wherein the overlay value is determined for a first production layer of the substrate.

6. The method according to claim 1, wherein:
   the temperature data is obtained from one or more temperature sensors on the substrate table; and
   the one or more temperature sensors are arranged to measure the temperature of the substrate table.

7. The method according to claim 6, wherein:
   there are a plurality of temperature sensors; and
   the temperature data comprises data from each of the plurality of temperature sensors.

8. The method according to claim 1, wherein:
   the measurement time period starts substantially when the substrate is loaded onto the table; and
   the measurement time period lasts between 1 µs and 10 s.

9. The method according to claim 1, wherein the overlay value is determined in dependence on a magnitude of the measured temperature by one or more temperature sensors over the measurement time period.

10. The method according to claim 1, wherein the overlay value is determined in dependence on a gradient of the measured temperature by one or more temperature sensors over the measurement time period.

11. The method according to claim 1, wherein the overlay value is determined in dependence on relative values of the measured temperature by different ones of a plurality of temperature sensors over the measurement time period.

12. The method according to claim 1, wherein the overlay value is determined in dependence on a comparison of one or more of values of the measured temperature by one or more of the temperature sensors to one or more reference values.

13. The method according to claim 1, wherein the overlay value is determined substantially in real-time.

14. A substrate support system comprising:
   a substrate table;
   one or more temperature sensors arranged so that, when in use and after a substrate has been loaded onto the substrate table, the one or more temperature sensors obtain temperature data by measuring the temperature of the substrate table at one or more positions on the substrate table; and
   a computing system comprising a processor that is configured to determine an overlay value of the substrate in dependence on temperature data obtained by the one or more temperature sensors over a measurement time period and in dependence on a variance of the obtained temperature data at the one or more positions.

* * * * *